(12) United States Patent
Jain et al.

(10) Patent No.: US 11,815,717 B2
(45) Date of Patent: Nov. 14, 2023

(54) PHOTONIC CHIP SECURITY STRUCTURE

(71) Applicant: GLOBALFOUNDRIES U.S. Inc., Malta, NY (US)

(72) Inventors: Vibhor Jain, Williston, VT (US); Nicholas A. Polomoff, Irvine, CA (US); Yusheng Bian, Ballston Lake, NY (US)

(73) Assignee: GLOBALFOUNDRIES U.S. INC., Malta, NY (US)

( * ) Notice: Subject to any disclaimer, the term of this patent is extended or adjusted under 35 U.S.C. 154(b) by 0 days.

(21) Appl. No.: 17/525,293

(22) Filed: Nov. 12, 2021

(65) Prior Publication Data

US 2023/0152518 A1    May 18, 2023

(51) Int. Cl.
| | |
|---|---|
| *G02B 6/12* | (2006.01) |
| *G02B 6/122* | (2006.01) |
| *G02B 6/24* | (2006.01) |
| *H01L 23/00* | (2006.01) |

(52) U.S. Cl.
CPC ............. *G02B 6/122* (2013.01); *G02B 6/243* (2013.01); *H01L 23/573* (2013.01); *G02B 2006/12061* (2013.01); *G02B 2006/12126* (2013.01)

(58) Field of Classification Search
CPC .......... G02B 6/243; G02B 2006/12126; H01L 23/57; H01L 23/573
See application file for complete search history.

(56) References Cited

U.S. PATENT DOCUMENTS

| | | | | |
|---|---|---|---|---|
| 5,321,779 | A | * | 6/1994 | Kissa ............... G02B 6/264 385/129 |
| 6,298,178 | B1 | * | 10/2001 | Day .................. G02B 6/125 385/129 |
| 6,496,022 | B1 | | 12/2002 | Kash et al. |
| 6,611,636 | B2 | | 8/2003 | Delivala |
| 6,748,125 | B2 | | 6/2004 | Delivala |
| 6,839,488 | B2 | | 1/2005 | Gunn, III |
| 7,115,912 | B2 | | 10/2006 | Kash et al. |
| 7,260,293 | B1 | | 8/2007 | Gunn, III et al. |
| 7,295,455 | B2 | | 11/2007 | Okuda |
| 7,373,030 | B2 | * | 5/2008 | Gao .................. G02B 6/122 385/14 |
| 7,884,625 | B2 | | 2/2011 | Bartley et al. |
| 8,089,285 | B2 | | 1/2012 | Hsu et al. |
| 8,110,894 | B2 | | 2/2012 | Savry et al. |
| 8,198,641 | B2 | | 6/2012 | Zachariasse |

(Continued)

FOREIGN PATENT DOCUMENTS

WO    WO 2020/087025 A1 *   4/2020

OTHER PUBLICATIONS

Office Action in U.S. Appl. No. 17/070,377 dated Dec. 27, 2022, 12 pages.

(Continued)

*Primary Examiner* — Michael Stahl
(74) *Attorney, Agent, or Firm* — Anthony Canale; Andrew M. Calderon; Calderon Safran & Cole P.C.

(57) ABSTRACT

The present disclosure relates to semiconductor structures and, more particularly, to a photonic chip security structure and methods of manufacture. The structure includes an optical component and a photonic chip security structure having a vertical wall composed of light absorbing material surrounding the optical component.

18 Claims, 8 Drawing Sheets

(56) References Cited

U.S. PATENT DOCUMENTS

| | | | |
|---|---|---|---|
| 8,664,047 B2 | 3/2014 | Lower et al. | |
| 8,742,830 B2 | 6/2014 | Luo et al. | |
| 8,809,858 B2 | 8/2014 | Lisart et al. | |
| 8,938,627 B2 | 1/2015 | Oggioni et al. | |
| 8,946,859 B2 | 2/2015 | Lisart et al. | |
| 9,075,251 B2 | 7/2015 | Dwivedi et al. | |
| 9,117,833 B2 | 8/2015 | Mougin et al. | |
| 9,306,573 B2 | 4/2016 | McCollum | |
| 9,455,233 B1 | 9/2016 | Bhooshan et al. | |
| 9,565,021 B1 | 2/2017 | Czaplewski et al. | |
| 9,741,670 B2 | 8/2017 | Charbonnier et al. | |
| 9,953,727 B1 | 4/2018 | Fifield et al. | |
| 9,965,652 B2 | 5/2018 | Joharapurkar et al. | |
| 11,101,010 B2 | 8/2021 | Hunt-Schroeder et al. | |
| 11,121,097 B1 | 9/2021 | Jain et al. | |
| 11,171,095 B1 | 11/2021 | Jain et al. | |
| 2001/0033012 A1 | 10/2001 | Kommerling et al. | |
| 2003/0091303 A1* | 5/2003 | Kami | G02B 6/4277 385/14 |
| 2005/0105842 A1* | 5/2005 | Vonsovici | G02B 6/122 385/14 |
| 2005/0141843 A1 | 6/2005 | Warden et al. | |
| 2008/0044130 A1* | 2/2008 | Pitwon | G02B 6/122 385/14 |
| 2010/0026313 A1 | 2/2010 | Bartley et al. | |
| 2010/0059822 A1 | 3/2010 | Pinguet et al. | |
| 2010/0327385 A1* | 12/2010 | Shiba | H01L 31/105 257/E31.127 |
| 2011/0006284 A1* | 1/2011 | Cho | G02B 6/1225 257/14 |
| 2011/0193221 A1 | 8/2011 | Hu et al. | |
| 2014/0035136 A1 | 2/2014 | Buer et al. | |
| 2014/0353849 A1 | 12/2014 | Arora et al. | |
| 2015/0192735 A1* | 7/2015 | Ellis-Monaghan | G02B 6/125 427/163.2 |
| 2015/0214163 A1 | 7/2015 | Kuenemund et al. | |
| 2015/0219850 A1* | 8/2015 | Fish | H04B 10/00 385/14 |
| 2016/0307855 A1 | 10/2016 | Charbonnier et al. | |
| 2017/0168234 A1* | 6/2017 | Shi | G02B 6/12004 |
| 2018/0075921 A1 | 3/2018 | Fifield et al. | |
| 2018/0219112 A1 | 8/2018 | Norberg et al. | |
| 2019/0025504 A1* | 1/2019 | Tsujita | G02B 6/138 |
| 2019/0027535 A1 | 1/2019 | Kumar et al. | |
| 2020/0076622 A1 | 3/2020 | Best | |
| 2020/0125716 A1 | 4/2020 | Chittamuru et al. | |
| 2020/0251602 A1 | 8/2020 | Shen et al. | |
| 2020/0328162 A1 | 10/2020 | Haba et al. | |
| 2021/0082532 A1 | 3/2021 | Hunt-Schroeder et al. | |
| 2021/0084800 A1* | 3/2021 | Yan | G02F 1/21 |
| 2021/0109283 A1 | 4/2021 | Meagher et al. | |
| 2021/0242651 A1* | 8/2021 | Dudley | G02B 6/12004 |

OTHER PUBLICATIONS

Response to Office Action in U.S. Appl. No. 17/070,377 dated Dec. 27, 2022, 8 pages.
Application and Drawings for U.S. Appl. No. 17/525,327, filed Nov. 12, 2021, 37 pages.
Notice of Allowance dated Jun. 1, 2022 in related U.S. Appl. No. 17/070,377, 5 pages.
Bashir et al., "SecONet: A Security Framework for a Photonic Network-on-Chip", IEEE, 2020, 8 pages.
Zhukovsky et al., "Bragg reflection waveguides as integrated sources of entangled photon pairs", Optical Society of America, vol. 29, No. 9, Sep. 2012, 8 pages.
Shen et al., "Nanopyramid: An Optical Scrambler Against Backside Probing Attacks", Florida Institute for Cyber Security (FICS) Research ECE Department, University of Florida, 10 pages.
Giewont et al., "300mm Monolithic Silicon Photonics Foundry Technology", IEEE Journal of Selected Topics in Quantum Electronics, vol. 25, No. 5, Sep./Oct. 2019, 11 pages.
Rakowski et al., "45nm CMOS—Silicon Photonics Monolithic Technology (45CLO) for next-generation, low power and high speed optical interconnects", IEEE, Downloaded on Nov. 15, 2020, 3 pages.
Bian et al., "Towards low-loss monolithic silicon and nitride photonic building blocks in state-of-the-art 300mm CMOS found", Frontiers in Optics/Laser Science © OSA 2020, 2 pages.
Bian et al., "Monolithically integrated silicon nitride platform", OFC 2021 © OSA 2021, 3 pages.
Application and Drawings for U.S. Appl. No. 17/223,596, filed Apr. 6, 2021, 23 pages.
Application and Drawings for U.S. Appl. No. 17/070,377, filed Oct. 14, 2020, 30 pages.
Boyer et al.,"Evaluation of the Near-Field Injection Method at Integrated Circuit Level", Freescale Semiconductor, Inc., Toulouse 31023, France, Sep. 2014, 8 pages.
Manich et al.,"Detection of Probing Attempts in Secure ICs", 2012 IEEE International Symposium on Hardware-Oriented Security and Trust, 6 pages.
Kumar, "A hollow waveguide Bragg reflector: A tunable platform for integrated photonics", Optics & Laser Technology, vol. 65, Abstract 2 pages.
Li et al., "Direct visualization of phase-matched efficient second harmonic and broadband sum frequency generation in hybrid plasmonic nanostructures", Official journal of the CIOMP 2047-7538, 2020, 10 pages.
Reshef et al., "Direct Observation of Phase-Free Propagation in a Silicon Waveguide", ACS Publications, Jul. 13, 2017, 16 pages.
Sterling, "New Security Risks Create Need For Stealthy Chips", Semiconductor Engineering, Oct. 3, 2019, 6 pages.
Vashistha et al., "Is Backside the New Backdoor in Modern SoCs?", International Test Conference, IEEE, 2019, 10 pages.
Cowen, "Hacking the unhackable", SPIE, Nov. 1, 2020, 8 pages.
Gomez, "How To Hack an Optical Fiber in Minutes . . . And How You Can Secure It", CIENA, Nov. 17, 2016, 3 pages.

* cited by examiner

PHOTONIC CHIP SECURITY STRUCTURE

FIELD OF THE INVENTION

The present disclosure relates to semiconductor structures and, more particularly, to a photonic chip security structure and methods of manufacture.

BACKGROUND

Photonic semiconductors have many applications in modern consumer electronics. For example, photonic semiconductors include optical modulators, quantum well (QW) lasers, photodiodes, and waveguide structures, etc. Silicon waveguides are also of special interest as they have unique guiding properties. For example, due to their unique guiding properties, waveguides can be used for communications, interconnects, and biosensors.

Silicon photonic devices can be made using existing semiconductor fabrication techniques, and because silicon is already used as the substrate for most integrated circuits, it is possible to create hybrid devices in which the optical and electronic components are integrated onto a single microchip. However, unlike electronic devices which have known protection techniques, the silicon photonic devices remain vulnerable to both physical and non-invasive attacks aimed at obtaining cryptographic encryption keys, certificates, intellectual property and other critical or sensitive data.

SUMMARY

In an aspect of the disclosure, a structure includes an optical component; and a photonic chip security structure including a vertical wall composed of light absorbing material surrounding the optical component.

In an aspect of the disclosure, a structure includes a semiconductor on insulator substrate; an optical component on the semiconductor on insulator substrate; a dielectric stack of material over the semiconductor on insulator substrate; and a vertical wall with lateral projections within the dielectric stack of material and surrounding the optical component.

In an aspect of the disclosure, a method includes forming an optical component; and forming a photonic chip security structure including a vertical wall composed of light absorbing material surrounding the optical component and further comprising lateral projections.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

Figure 1:
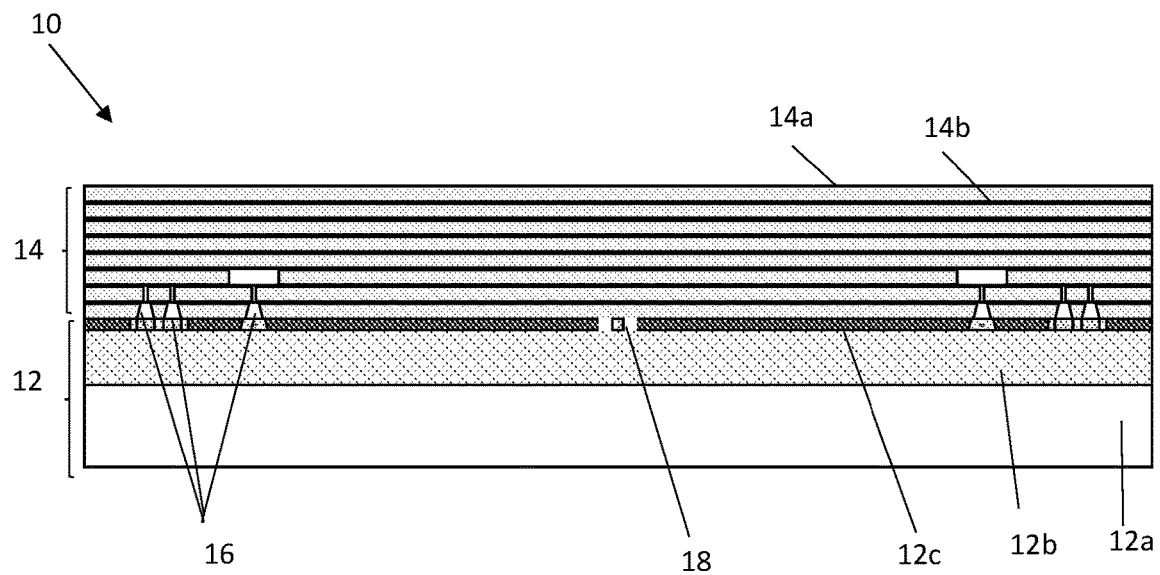
FIG. 1 shows an optical component, amongst other features, and respective fabrication processes in accordance with aspects of the present disclosure.

The present disclosure relates to semiconductor structures and, more particularly, to a photonic chip security structure and methods of manufacture. In embodiments, the photonic chip security structure includes a semiconductor absorption and scattering material surrounding a photonics component. As used herein, the term "surrounding" may be interpreted as walls on sides of the photonics component, on sides and over the photonics component or a complete enclosure about the photonics component. As to the latter example, the enclosure may include sidewalls, a top wall and a bottom wall, as an example. The semiconductor absorption and scattering material may be a vertical wall or enclosure surrounding the photonics component which absorbs any optical hacking signal (e.g., incoming radiation). Advantageously, the vertical semiconductor absorption and scattering layer provides security for optical signals for sensitive optical parts without impacting optical performance and functionality of the photonics component.

More specifically, the semiconductor absorption and scattering layer may be a vertical wall that surrounds an optical component, e.g., optical photonic waveguides or other critical optical components. The vertical semiconductor absorption and scattering material (e.g., vertical wall) may surround the optical component on either or both sides of the optical component in order to absorb and/or scatter incoming radiation (e.g., to absorb any optical hacking signal). For example, the semiconductor absorption and scattering material may be a vertical wall comprising polyGermanium (polyGe) or polySilicon (polySi) or polySiGe, any of which may absorb incoming radiation. In embodiments, the vertical wall may also include lateral projections which are structured to scatter incoming radiation. The semiconductor absorption and scattering material can also include a top layer and, in embodiments, a bottom layer, to form a security box around the optical component. The optical component may be front end of the line Si components or a back end of the line dielectric waveguide components, amongst other optical components.

The photonic chip security structure composed of the semiconductor absorption and scattering layer of the present disclosure can be manufactured in a number of ways using a number of different tools. In general, though, the methodologies and tools are used to form structures with dimensions in the micrometer and nanometer scale. The methodologies, i.e., technologies, employed to manufacture the photonic chip security structure of the present disclosure have been adopted from integrated circuit (IC) technology. For example, the structures are built on wafers and are realized in films of material patterned by photolithographic processes on the top of a wafer. In particular, the fabrication of the photonic chip security structure uses three basic building blocks: (i) deposition of thin films of material on a substrate, (ii) applying a patterned mask on top of the films by photolithographic imaging, and (iii) etching the films selectively to the mask.

FIG. 1 shows an optical component, amongst other features, and respective fabrication processes in accordance with aspects of the present disclosure. More specifically, the structure 10 includes a substrate 12 and dielectric stack of materials 14 with one or more electronic component 16 and an optical component 18. In embodiments, the electronic components 16 may be any passive or active device including, e.g., transistors with contacts and metal wiring layers, etc. The optical component 18 may be any optical component such as, e.g., a waveguide or other photonic devices amongst many different examples.

The substrate 12 is preferably a semiconductor-on-insulator (SOI) substrate. For example, the substrate 12 includes a semiconductor handle substrate 12a, an insulator layer 12b and a semiconductor layer 12c. In embodiments, the semiconductor handle substrate 12a and semiconductor layer 12c may be composed of any suitable material including, but not limited to, Si, SiGe, SiGeC, SiC, GaAs, InAs, InP, and other III/V or II/VI compound semiconductors. The semiconductor layer 12c may also comprise any suitable crystallographic orientation (e.g., a (100), (110), (111), or (001) crystallographic orientation). The insulator layer 12b may include a dielectric material such as silicon dioxide, silicon nitride, silicon oxynitride, boron nitride or a combination thereof and, preferably, a buried oxide layer (BOX) supported on the semiconductor handle substrate 12a.

Still referring to FIG. 1, the dielectric stack of materials 14 may comprise alternating layers of dielectric material 14a, 14b. For example, the dielectric stack of materials 14 may include alternating layers of oxide material 14a and nitride material 14b. In more specific embodiments, the oxide material 14a may include $SiO_2$ and the nitride material 14b may include SiN. The alternating layers of dielectric material 14a, 14b may be deposited by conventional deposition methods such as, e.g., chemical vapor deposition (CVD).

Figure 2:
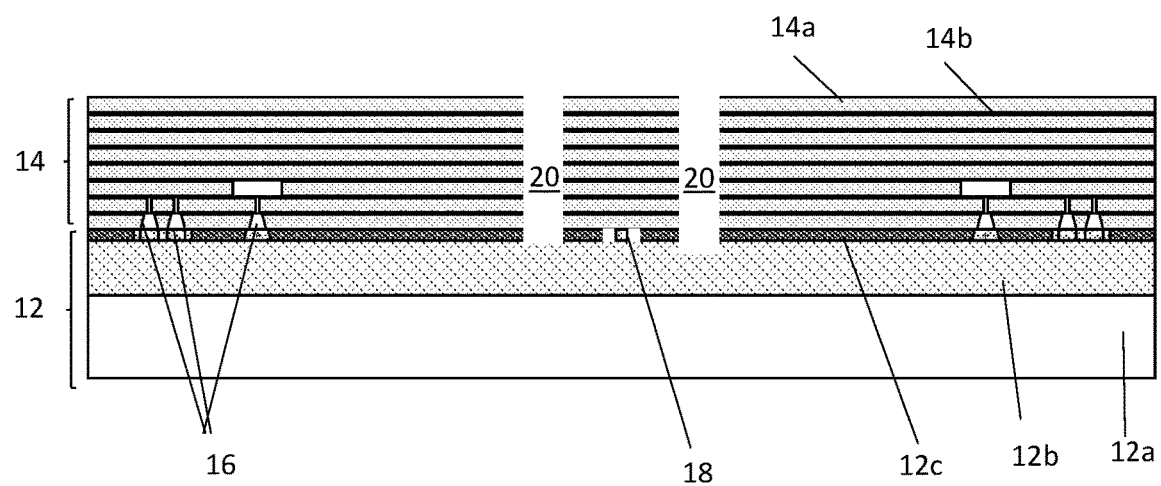
FIG. 2 shows trenches formed through a dielectric stack and surrounding the optical component, amongst other features, and respective fabrication processes in accordance with aspects of the present disclosure.

In FIG. 2, trenches 20 are formed through the dielectric stack 14. In more specific embodiments, the trenches 20 are formed through the dielectric stack of materials 14 on sides of the optical component 18. In this layout scheme, the optical component 18 may be a front end of the line Si optical component; although, it is also contemplated that the optical component 18 may be a back end of the line SiN optical component within the dielectric stack of materials 14.

The trenches 20 can be formed by conventional lithography and etching methods known to those of skill in the art. For example, a resist formed over the dielectric stack of materials 14 is exposed to energy (light) to form a pattern (opening). An etching process with a selective chemistry, e.g., reactive ion etching (RIE), will be used to transfer the pattern from the resist layer to the dielectric stack of materials 14 to form one or more trenches 20 in the dielectric stack of materials 14. In embodiments, the trenches 20 will extend to the buried insulator layer 12b; however, it is also contemplated that the trenches 20 can extend into the insulator layer 12b.

Figure 3:
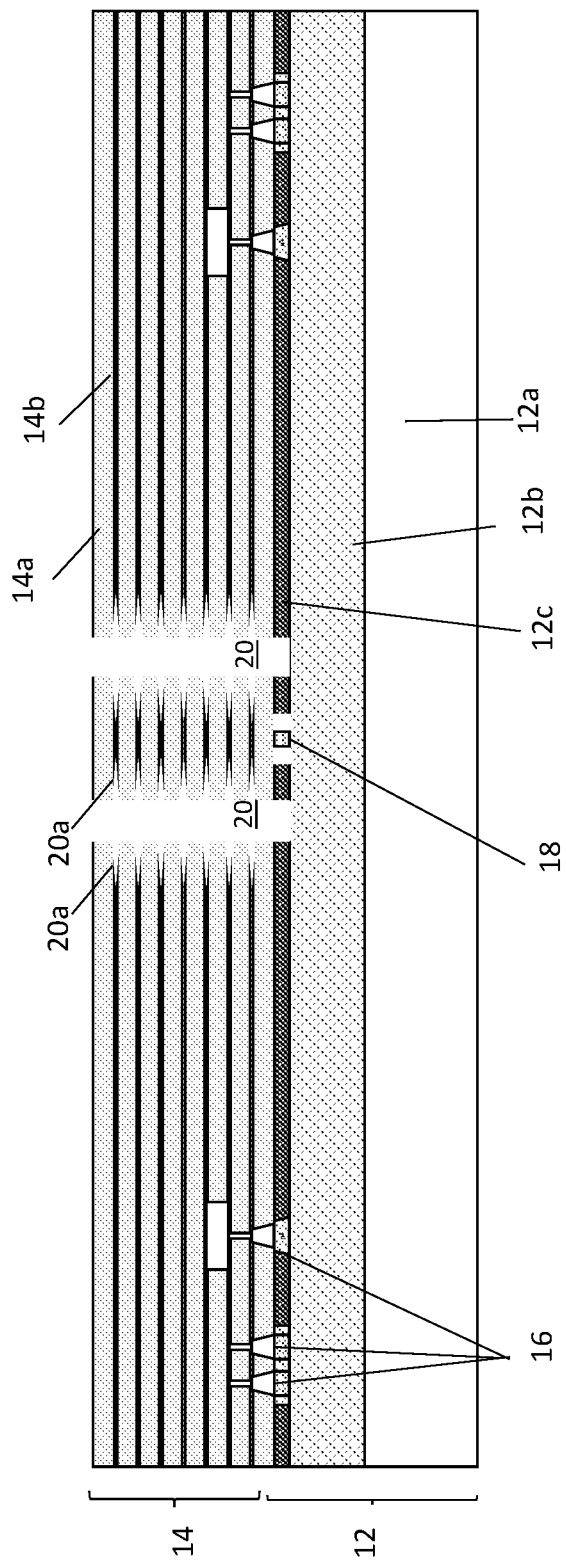
FIG. 3 shows lateral projections extending from the trenches, amongst other features, and respective fabrication processes in accordance with aspects of the present disclosure.

As shown in FIG. 3, an additional etching process may be performed to form lateral projections 20a on opposing sides of the trenches 20. In embodiments, the additional etching process may be a hot phosphorous etch which selectively attacks the exposed alternating dielectric layers 14b within the trenches 20, providing a pull back of these layers 14b starting from the trenches 20. In this way, the lateral projections 20a are formed in the alternating dielectric layers 14b, e.g., between the layers 14a.

Figure 4:
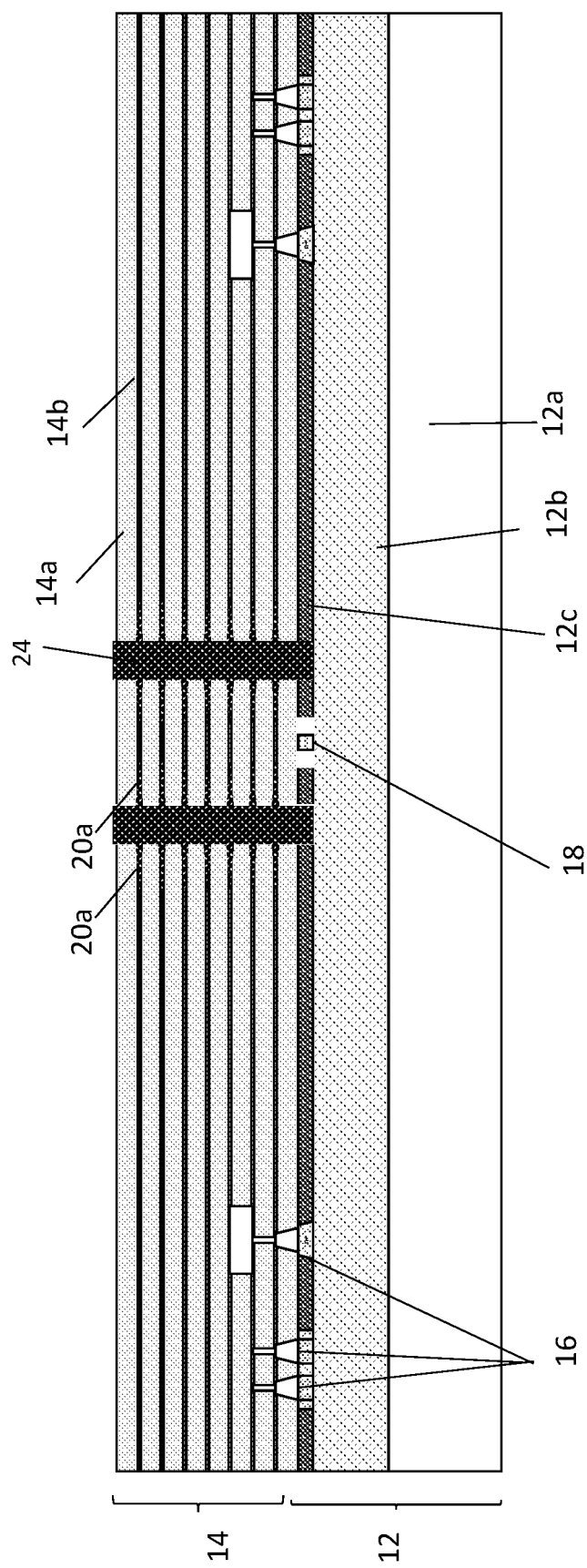
FIG. 4 shows the trenches filled with light absorbing material, amongst other features, and respective fabrication processes in accordance with aspects of the present disclosure.

As shown in FIG. 4, light absorbing material 24 may be formed within the trenches 20 and lateral projections 20a to form the photonic chip security structure. In this way, the photonic chip security structure includes a vertical wall of the light absorbing material 24 which surrounds the optical component 18, e.g., photonic waveguides or functional optical devices. In embodiments, the vertical wall of the light absorbing material 24 may be polyGe material or polySi material or polySiGe material, as examples. The light absorbing material 24 may be deposited using, for example, CVD processes. Any residual material on the surface of the dielectric stack of materials 14 may be removed by conventional chemical mechanical polishing (CMP) processes.

In embodiments, the Ge content in the SiGe material is preferably greater than 25%; although other percentage contents may be used depending on the desired absorption rate of incoming radiation. In further embodiments, the polysilicon material can be used for shorter wavelengths of incoming radiation. In any scenario described herein, the polyGe material or polySi material or polySiGe material provides absorption properties of the incoming radiation; whereas the material within the lateral projections 20a provides a scattering effect of the incoming radiation.

Figure 5:
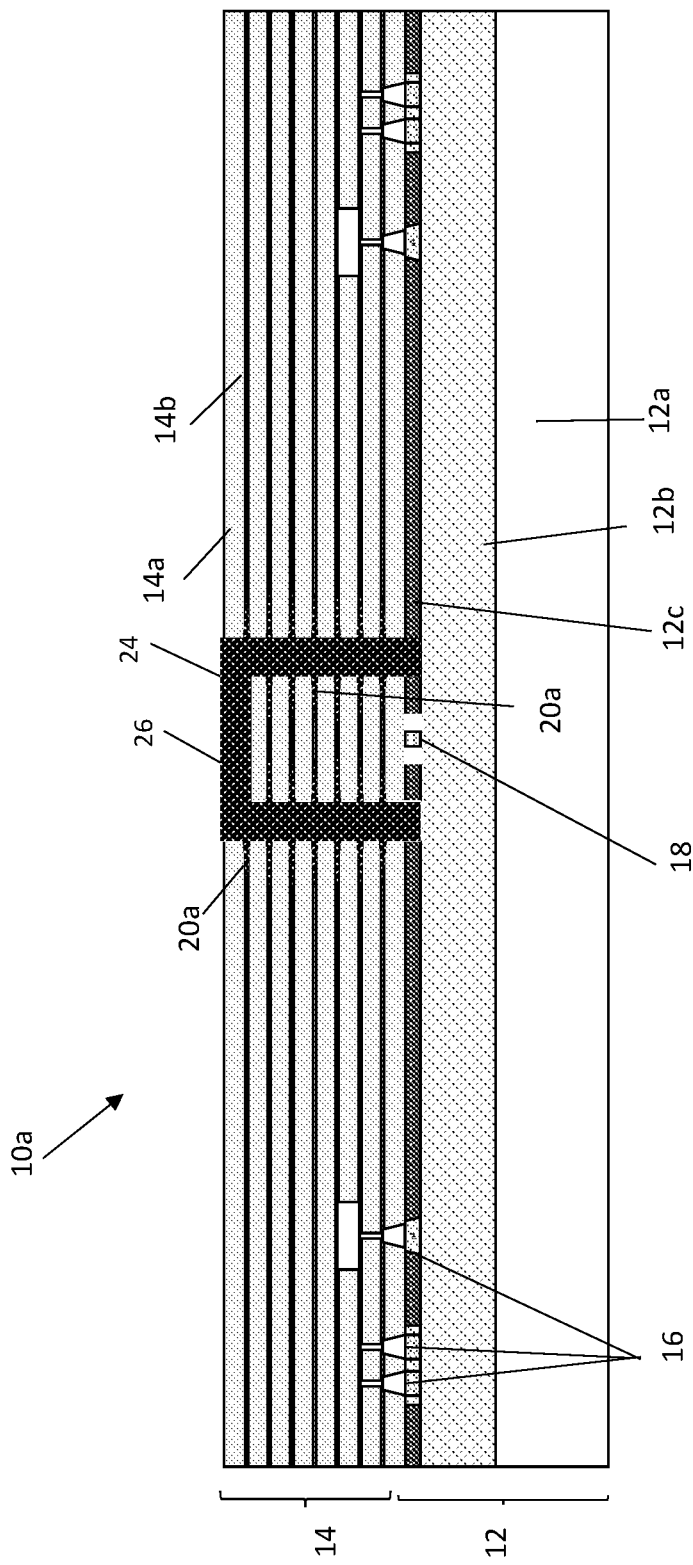
FIGS. 5-9 show various alternate embodiments of trenches filled with light absorbing material, amongst other features, and respective fabrication processes in accordance with additional aspects of the present disclosure.

FIG. 5 shows an alternative photonic chip security structure 10a. In this embodiment, the photonic chip security structure 10a includes a top layer of light absorbing material 26 connected to the vertical walls of the light absorbing material 24. In this way, an enclosure is formed around (e.g., surrounding) the optical component 18 from sides and a top. In embodiments, the light absorbing material 26 can be the same material as the light absorbing material 24. In alternative embodiments, the light absorbing material 24 can be a different material than the light absorbing material 26. For example, the light absorbing material 26 may be polyGe and the light absorbing material 24 may be polySi. The present disclosure also contemplates other combinations of the polyGe material or polySi material or polySiGe material.

Figure 6:
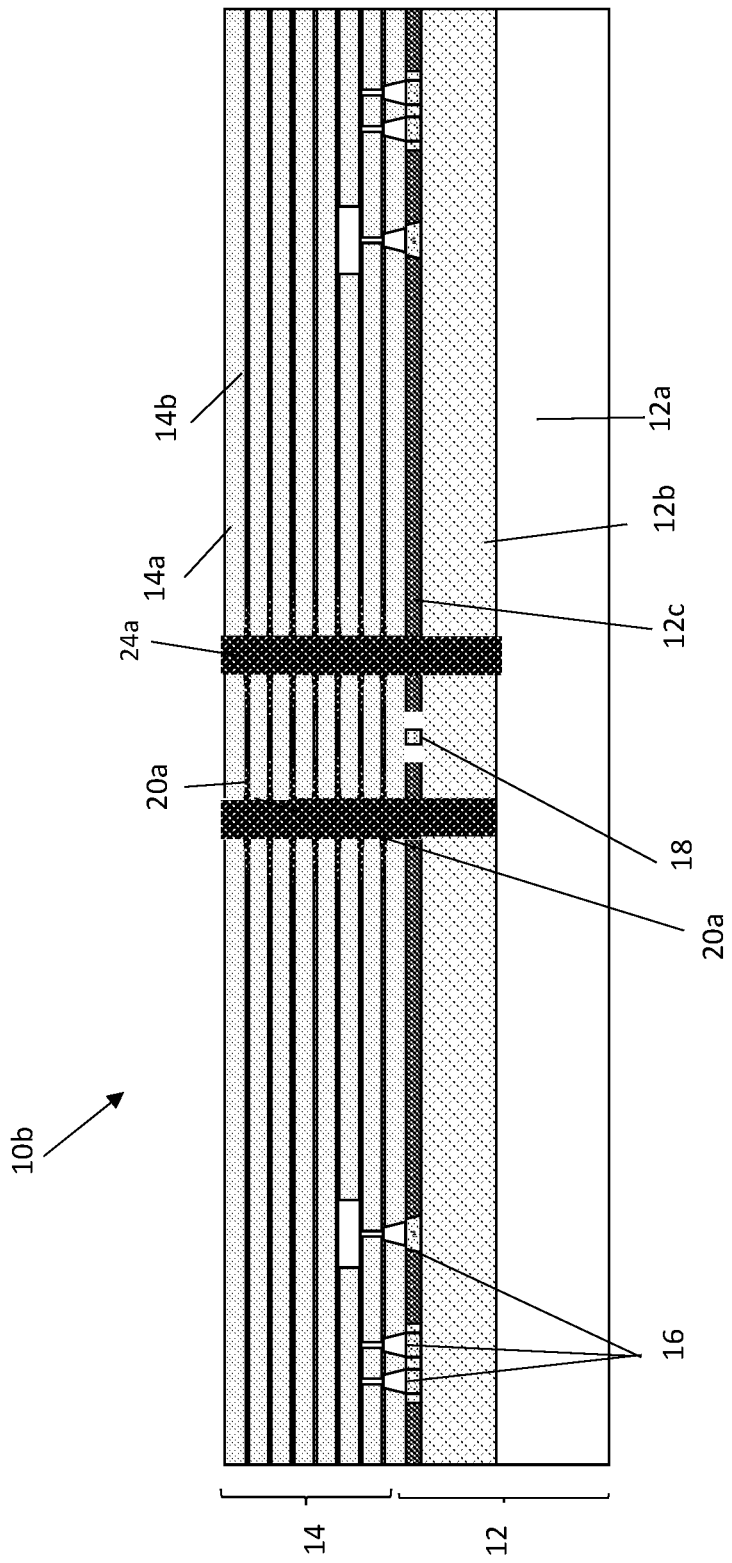

FIG. 6 shows another embodiment of the photonic chip security structure 10b. In this embodiment, the photonic chip security structure 10b includes vertical walls of the light absorbing material 24a extending into the buried insulator layer 12b. The remaining features are similar to that described in FIG. 4.

Figure 7:
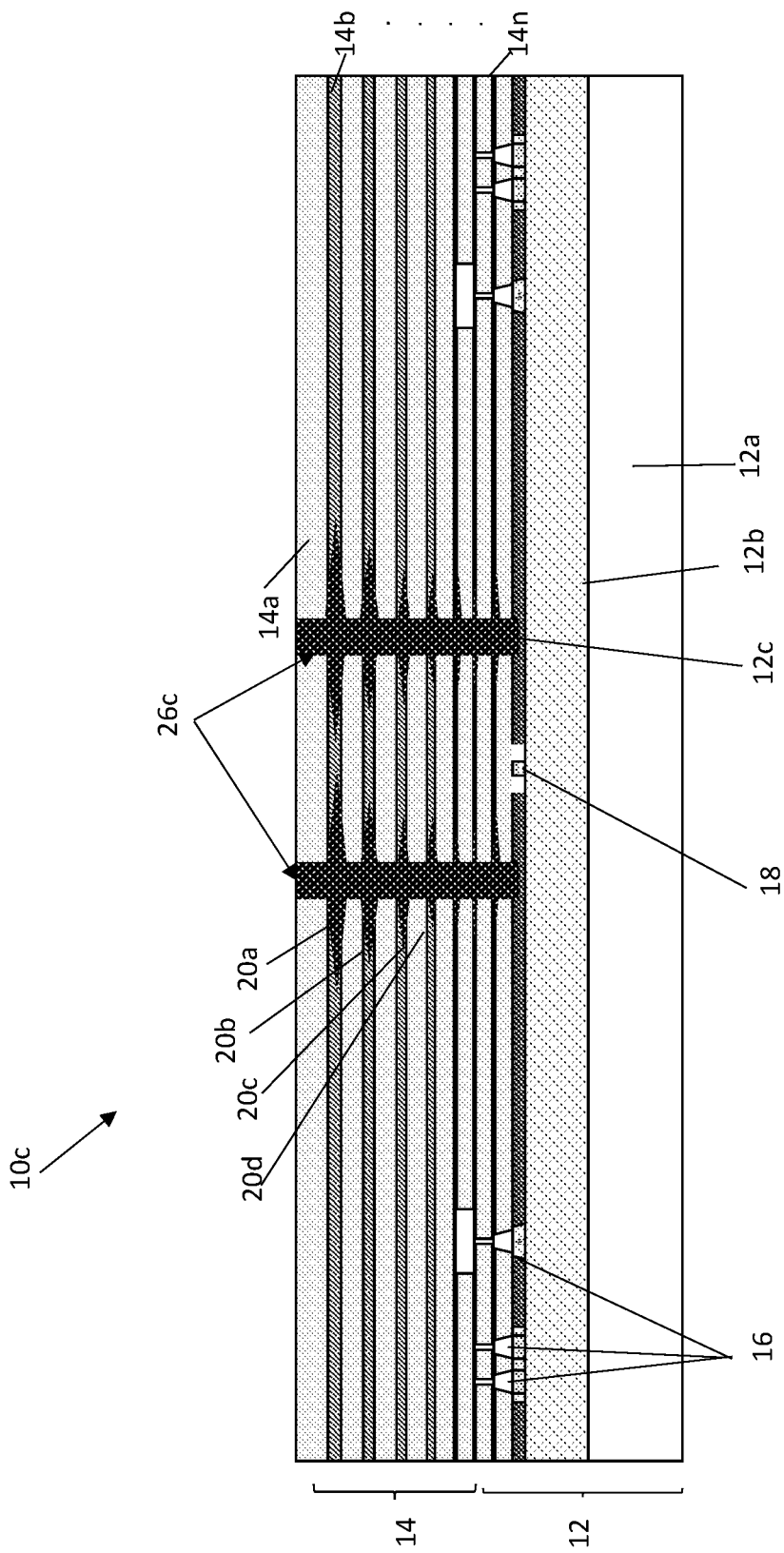

FIG. 7 shows an embodiment of the photonic chip security structure 10c with lateral projections 20a, 20b, 20c, 20d of different lengths (and/or sizes) within the different alternating layers 14b . . . 14n of the dielectric stack of materials 14. Although FIG. 7 shows that the lateral projections 20a, 20b, 20c, 20d become progressively smaller and narrower in width from top to bottom, the present disclosure contemplates any arrangement of different lengths within the different alternating layers 14b . . . 14n. In this embodiment, different thicknesses of the alternating layers 14b . . . 14n of the dielectric stack of materials 14 are used, with the use of the thicker layers resulting in a longer and wider lateral projection. For example, the longer and wider lateral projections are formed in the thicker layers due to the fact that more etchants can reach further into the layers as they become thicker. The remaining features are similar to that described in FIG. 4.

Figure 8:
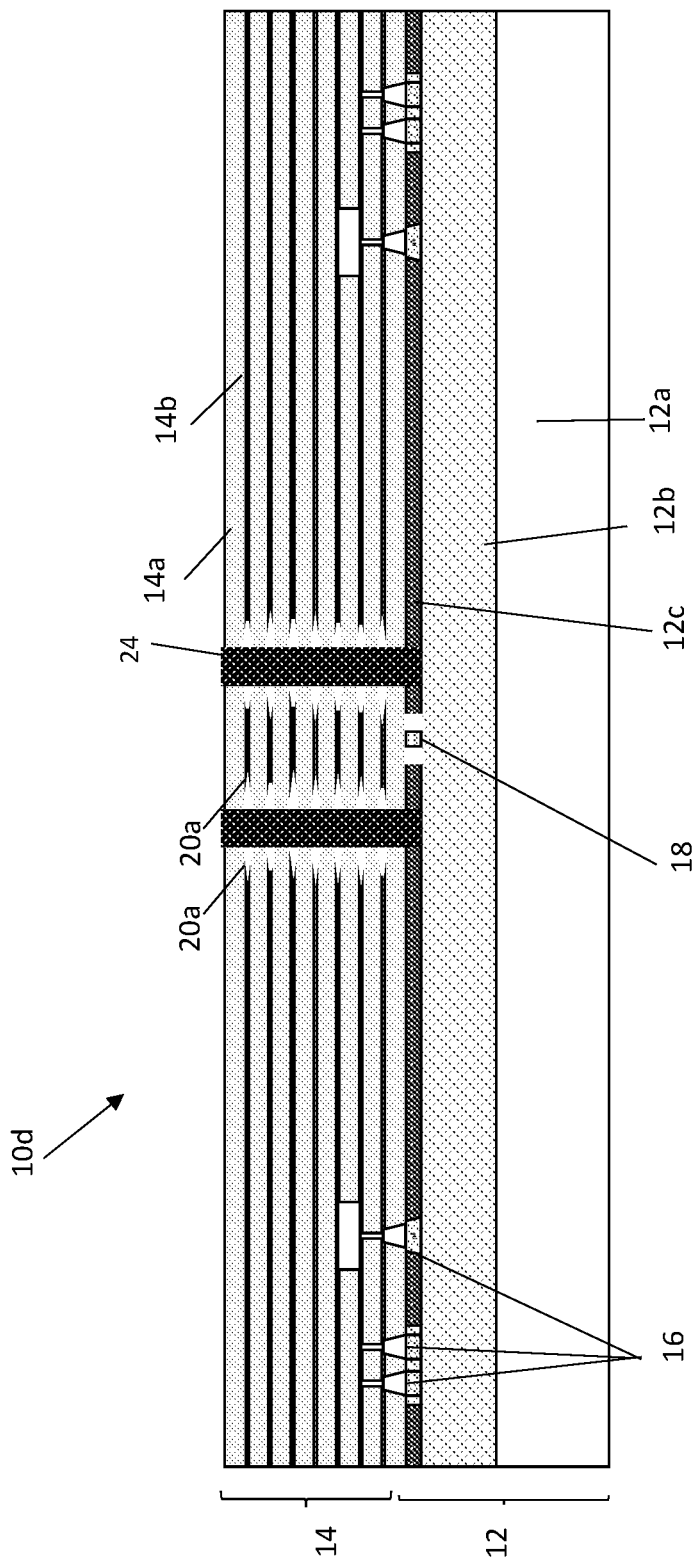

FIG. 8 shows another embodiment of the photonic chip security structure 10d. In this embodiment, the lateral projections 20a are devoid of any light absorbing material. In this way, the lateral projections 20a can be airgaps on opposing sides of the vertical wall of light absorbing material 24. The airgaps may be formed by using a non-conformal deposition method which results in a pinch-off phenomenon as is known in the art. The remaining features are similar to that described in FIG. 4.

Figure 9:
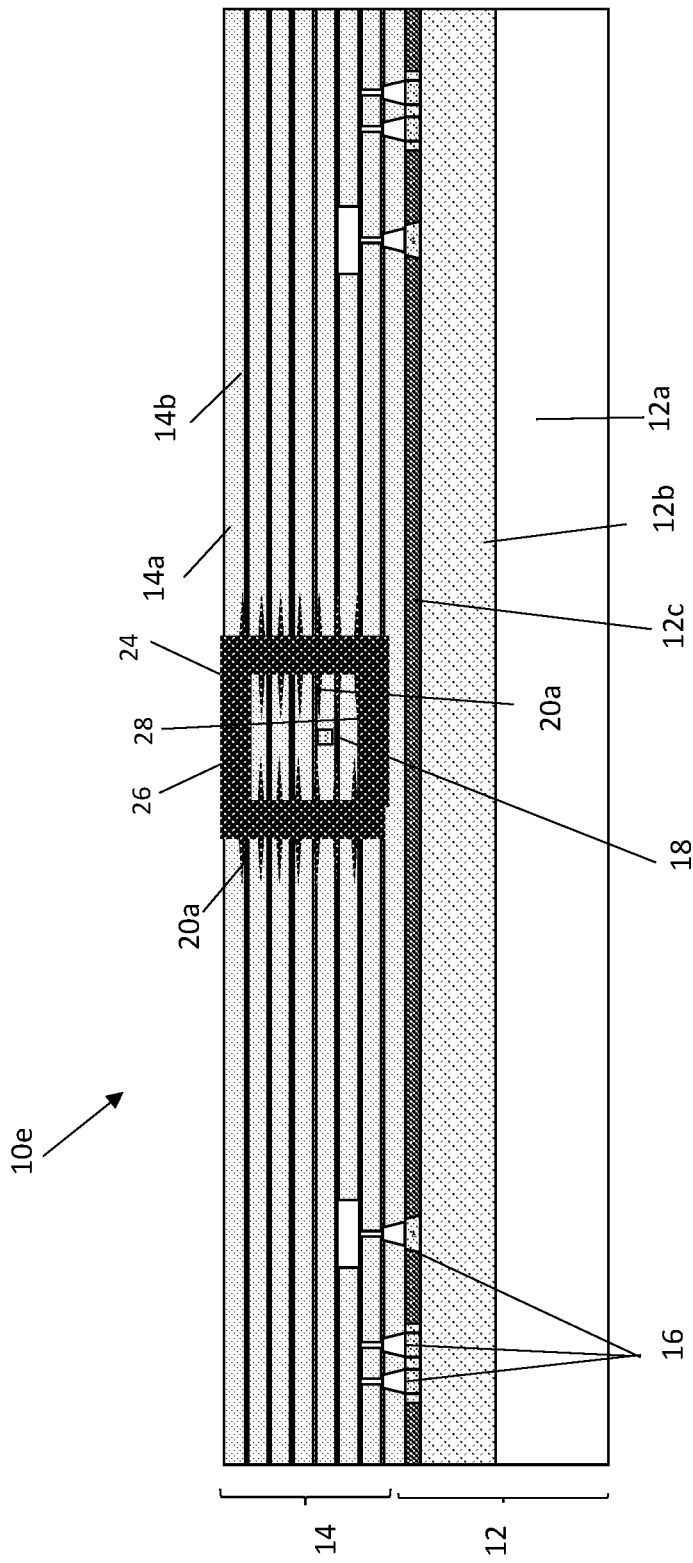

In FIG. 9, an embodiment of the photonic chip security structure 10e includes a back end of the line SiN optical component within the dielectric stack of materials 14 and which is completely surrounded by vertical sidewalls of the light absorbing material 24, in addition to a top wall of light absorbing material 26 and a bottom wall of light absorbing material 28. As in the previous embodiments, the vertical walls 24, top wall 26 and bottom wall 28 may be fabricated using conventional lithography, etching and deposition methods as described herein. In addition, any combination of light absorbing material may be used in the vertical walls 24, top wall 26 and bottom wall 28. For example, the light absorbing material in the top wall 26 and bottom wall 28 can be the same material or different material as the light absorbing material in the vertical wall 24. In alternative embodiments, the light absorbing material 24 can be a different material in the top wall 26 and bottom 28, etc. The remaining features are similar to that described in FIG. 4.

The semiconductor absorption and scattering layer can be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections and buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
    an optical component on a semiconductor substrate and which is surrounded by dielectric material of a dielectric stack of material; and
    a photonic chip security structure comprising a vertical wall composed of light absorbing material, the vertical wall of the photonic chip security structure being on sides of the optical component and extending through the dielectric stack of material,
    wherein the semiconductor substrate comprises a silicon-on-insulator (SOI) substrate and the vertical wall extends through a semiconductor layer of the SOI substrate and onto an underlying buried oxide layer under the semiconductor layer of the SOI substrate,
    wherein the vertical wall comprises lateral projections, the lateral projections comprising the light absorbing material.

2. The structure of claim 1, wherein the dielectric stack of material includes an oxide based material and a nitride based material, and the lateral projections are provided within the nitride based material.

3. The structure of claim 1, wherein the lateral projections are of different sizes along a height of the vertical wall.

4. The structure of claim 1, further comprising a top wall connecting to the vertical wall and over the optical component.

5. The structure of claim 1, further comprising a bottom wall connecting to the vertical wall and under the optical component.

6. The structure of claim 1, wherein the light absorbing material comprises one of polySiliconGermanium, polyGermanium and polySilicon.

7. The structure of claim 1, wherein the optical component comprises one of a waveguide, an optical component at a back end of the line area and an optical component at a front end of the line area and the vertical wall extends into the underlying buried oxide layer.

8. A structure comprising:
    a semiconductor substrate;
    an optical component on the semiconductor substrate;
    a dielectric stack of material over the semiconductor substrate; and
    a vertical wall with lateral projections within the dielectric stack of material, and the vertical wall being positioned on sides of the optical component,
    wherein the semiconductor substrate comprises a semiconductor on insulator (SOI) substrate and the vertical wall extends into a buried insulator material of the SOI substrate.

9. The structure of claim 8, wherein the dielectric stack of material comprises alternating dielectric materials composed of a first insulator material and a second insulator material different than the first insulator material.

10. The structure of claim 8, wherein the lateral projections are provided in the first insulator material.

11. The structure of claim 10, wherein the lateral projections comprise different sizes.

12. The structure of claim 8, wherein the vertical wall and lateral projections comprise light absorbing material.

13. The structure of claim 8, wherein the vertical wall comprises light absorbing material and lateral projections comprise airgaps.

14. The structure of claim 8, further comprising at least a top wall over the optical component and connecting to the vertical wall to enclose the optical component.

15. A method comprising:
    forming an optical component on a semiconductor substrate and which is surrounded by dielectric material of a dielectric stack of material; and
    forming a photonic chip security structure comprising a vertical wall composed of light absorbing material, the vertical wall of the photonic chip security structure being formed on sides of the optical component and extending through the dielectric stack of material, wherein the semiconductor substrate comprises a silicon-on-insulator (SOI) substrate and the vertical wall extends through a semiconductor layer and onto an underlying buried oxide layer under the semiconductor layer of the SOI substrate, and wherein the vertical wall comprises lateral projections, the lateral projections comprising the light absorbing material.

16. The structure of claim 8, wherein the optical component is surrounded by dielectric material of the stack of material, the dielectric stack of material on the buried insulator material and over a semiconductor layer.

17. The structure of claim 8, wherein the vertical wall on sides of the optical component extends through the dielectric stack of material and a semiconductor layer and into the buried insulator material.

18. The structure of claim 8, wherein the lateral projections are airgaps which extend outwardly from opposing sidewalls of the vertical wall and extend into the dielectric stack of material.

* * * * *